United States Patent [19]

Germer

[11] Patent Number: 4,999,575
[45] Date of Patent: Mar. 12, 1991

[54] POWER SUPPLY AND MONITOR FOR CONTROLLING AN ELECTRICAL LOAD FOLLOWING A POWER OUTAGE

[75] Inventor: Warren R. Germer, Dover, N.H.
[73] Assignee: General Electric Company, Somersworth, N.H.
[21] Appl. No.: 412,036
[22] Filed: Sep. 25, 1989
[51] Int. Cl.⁵ .................... G01R 11/64; G01R 15/08
[52] U.S. Cl. ............................... 324/142; 324/103 R; 324/116
[58] Field of Search .................. 324/142, 103 R, 116; 364/483, 492; 340/637; 307/66, 130; 371/66; 365/229

[56] References Cited

U.S. PATENT DOCUMENTS

| | | | |
|---|---|---|---|
| 4,199,717 | 4/1980 | Germer et al. | 324/103 R |
| 4,429,366 | 1/1984 | Kennon | 371/66 |
| 4,465,970 | 8/1984 | DiMassimo et al. | 324/103 R |
| 4,509,128 | 4/1985 | Coppola et al. | 324/103 R |
| 4,584,651 | 4/1986 | Carey, Jr. et al. | 364/483 |
| 4,591,782 | 5/1986 | Germer | 324/116 |

Primary Examiner—Reihnard J. Eisenzopf
Assistant Examiner—Vinh P. Nguyen
Attorney, Agent, or Firm—Robert E. Brunson

[57] ABSTRACT

A metering system includes an electronic register having a non-volatile storage into which data is written upon the detection of a power outage. A power supply and monitor provides a regulated voltage for the electronic register and contains a capacitor which normally stores a sufficient quantity of electric energy to continue operation of the electronic register for a long enough period of time to complete the writing of data to the non-volatile storage. The discharge rate of the capacitor is linearly controlled to sustain the regulated voltage at its normal regulated value for the required period of time. An electronic meter is shut down upon the detection of a power outage to remove a portion of the load on the power supply to aid in sustaining the regulated voltage for the required period of time. The detection of momentary power outages is prevented by forcing the capacitor to charge to a prescribed voltage level before a subsequent outage can be detected. The capacitor is also forced to maintain a minimum charge between momentary power outages which is sufficient to sustain the regulated voltage for the required period upon the detection of a non-momentary power outage following a previous momentary outage which caused the capacitor to discharge below its minimum charge.

23 Claims, 4 Drawing Sheets

POWER SUPPLY AND MONITOR FOR CONTROLLING AN ELECTRICAL LOAD FOLLOWING A POWER OUTAGE

BACKGROUND OF THE INVENTION

The present invention relates generally to electrical power outage detection apparatus, and more particularly, to power supplies and power monitors for use with electrical and electronic loads requiring an orderly shutdown in the event of a power outage.

While the invention has use in many electronic systems where an electrical load, such as a computer, must be controlled, it finds particular application in metering systems for powering and controlling electronic meters and electronic microprocessor based registers.

For several years, electronic registers have been installed on conventional induction type watthour meters for registering electrical energy consumption. In a meter of this type, a pulse initiator provides pulses proportional to electrical energy consumption to an electronic register which accumulates and stores the pulses as data representative of such consumption. This data can then be retrieved periodically by a utility company meter reader and used to bill the consumer.

There are various types of electronic registers in use in meters today, two of which are the well known time of use register and the demand register. Both of these registers generally have a micro computer or processor which stores the accumulated meter data in a volatile memory. During normal operation, if power to the electronic register is lost, or interrupted for a sustained period the data in the volatile memory can be lost. Thus, it can be seen that a need exists to prevent this loss of data.

The time of use register usually employs its own power supply and a battery back-up system for supplying the necessary bias voltages to the register during the period of a power outage to prevent the loss of data in its volatile memory. This type of register usually contains a circuit which detects a power outage or low voltage condition from its power supply for switching in the battery back-up system. When a power outage is detected, the register's micro processor usually goes through an orderly shutdown procedure to place the register in a low power mode whereby battery back-up voltage is provided to only those register circuits necessary for time keeping and the preservation of the meter data; namely the register's clock calendar and its volatile memory.

The electronic demand register, like the time of use register, also usually contains its own power supply for providing the necessary bias voltages to the register circuits. However, unlike the time of use register, the demand register does not have a battery back-up system. Instead, the electronic demand register employs a non-volatile data storage or memory for receiving and storing data from the register's micro processor volatile memory when a power outage is detected by the register. The data is thus preserved during the power outage and can be written back to the volatile memory upon the restoration of power to the demand register's power supply.

In the electronic demand register, it takes its microprocessor a certain period of time to read the data from its volatile memory and write that data to the non-volatile memory. During this period of time, the necessary bias voltages must be sustained at their proper levels to allow the microprocessor to carry out its memory read/write functions. U.S. Pat. No. 4,591,782, assigned to the assignee of the present invention, discloses an electronic demand register which includes a power supply and power monitor that enables the microprocessor to carry out these functions.

U.S. Pat. No. 4,591,782 discloses an electronic demand register which receives pulses proportional to power consumption from a conventional induction type watthour meter. The register includes a microprocessor, a volatile memory and a non-volatile memory. The register also includes its own power supply, power monitor and power fail detect circuitry for signalling the microprocessor of a power outage. Upon the receipt of a power fail detect signal, the microprocessor enters into a read/write cycle to transfer data from its volatile memory to the non-volatile memory. As previously mentioned, it takes a certain period of time to complete the transfer of data into the non-volatile memory. The power supply and monitor contains a storage capacitor which stores a sufficient quantity of electrical energy to sustain a regulated DC voltage to the register at its normal value for the period of time required to carry out the transfer of the data into the non-volatile memory.

While the system disclosed in the aforementioned patent works well in its intended application it has certain limitations and cost disadvantages. One limitation is that the power supply, monitor and storage capacitor can accommodate only a single light load imposed by the demand register. In addition the demand register's complexity and cost is increased by the incorporation therein, of the power supply, monitor, storage capacitor and power fail detect and timing circuitry necessary to carry out the aforementioned read/write functions. In certain applications, enhanced system performance and manufacturing cost advantages can be realized by removing this complexity from the demand register (including other types of electronic registers and controllable loads) and designing it into a less complex universally useable power supply and monitor which can provide sufficient voltage and current during a power outage to a drive either a single load, such as a demand register, or a plurality of loads.

An application example of where the above performance and cost advantages can be achieved is in a fully electronic metering system. Fully electronic watthour meters are directly replacing the conventional induction type watthour meter in certain applications. These electronic watthour meters monitor energy consumption and provide data pulses proportional to energy consumption to an electronic register in a manner similar to the induction type watthour meter.

An electronic watthour meter, unlike the conventional induction type meter, requires a power supply for supplying the proper bias voltages to the meter circuits. These bias voltages can also be used by the circuits in an electronic register which receive pulses representative of energy consumption from the electronic meter.

Thus, it can be seen that a need exists for a universally useable power supply and monitor which can be used to supply operating voltages and currents to a plurality of loads, such as an electronic meter and an electronic register, and which can sustain the voltages applied to these loads for a prescribed period of time following a power outage to enable an orderly shutdown of at least one load.

OBJECTS AND SUMMARY OF THE INVENTION

Accordingly, it is an object of the invention to provide an electronic metering system having enhanced operating capabilities and which overcomes the disadvantages of the prior art.

It is a further object of the invention to provide an electronic metering system capable of detecting a power outage and sustaining, for a prescribed period of time following a power outage, the levels of voltages used by an electronic meter and an electronic register to carry out an orderly shutdown of the metering system.

It is another object of the invention to provide a power supply and power monitor for supplying a regulated voltage to at least one load and controlling the period of time that the regulated voltage remains at a prescribed level following a power outage to enable an orderly shutdown of the load.

It is still a further object of the invention to provide, in an electronic metering system, a power supply and power outage monitor capable of providing operating voltages to an electronic meter and an electronic register and sustaining the operating voltages at a prescribed level for a controlled period of time following a power outage to enable the electronic register to save volatile data in a non-volatile storage.

Briefly stated, the present invention provides, in an electronic metering system, a power supply and monitor for providing regulated DC voltages to an electronic meter and an electronic register having a programmable processor for storing data in a non-volatile memory upon the detection of an impending power outage. A storage element in the power supply and monitor stores a sufficient quantity of expendable electrical energy to continue operation of the electronic register for a long enough period to complete the writing of data to the non-volatile memory. The discharge rate of the storage element is linearly controlled by a current regulator monitor. Means is provided to detect a power outage to signal the electronic register to store data into the non-volatile memory and disable at least a portion of the circuitry in the electronic meter to reduce the load on the power supply upon detection of a power outage.

According to an embodiment of the invention, a power supply and monitor develop, from an AC power source, unregulated and regulated DC voltages. The regulated DC voltages are provided to electrical loads to power the electronic circuits therein. Upon the occurrence of a power outage, the unregulated voltage begins to decay from a first level to a second level. Upon achieving the second level, a power fail detect signal is generated to signal the loads of an impending power outage and to enable the loads to start an orderly shutdown. A storage capacitor stores a sufficient quantity of electrical energy from the unregulated DC voltage to enable the regulated DC voltages to remain at their regulated values long enough for the loads to complete their orderly shutdown. The discharge rate of the storage capacitor is controlled by a current regulator which monitors at least one regulated DC voltage. The storage capacitor is normally disconnected from the power supply load. When the magnitude of the regulated DC voltage drops to a prescribed level, the current regulator is activated to control the discharge rate of the storage capacitor and regulate the magnitude of the regulated DC voltage at a prescribed level for a period of time sufficiently long, to enable the loads to complete their orderly shutdown.

Various types of loads, such as an electronic register having a micro processor or computer, advantageously use an external reset to initialize the processor or computer in preparation for the restoration of power or at the time of initial power up. To that end, the invention provides means responsive to the regulated DC voltage passing through a prescribed threshold for resetting or initializing a load prior to the expiration of the above mentioned period of time or at the time of initial power up.

According to a feature of the invention, there is also provided a method of sustaining the application of a regulated DC voltage to an electrical load, such as a microprocessor or other controllable device, following the loss of power from an AC supply by; producing an unregulated DC voltage from electrical energy provided by the AC supply; producing a regulated DC voltage from the unregulated DC voltage; storing in a dischargeable energy storage element, such as a capacitor, a sufficient quantity of electric energy from the unregulated DC voltage to maintain the regulated voltage at a prescribed regulated value for a predetermined period of time following the loss of electrical energy from the AC supply; and monitoring the unregulated DC voltage, and in response to a drop in the magnitude thereof from a first value to a second value, regulating the magnitude of the regulated DC voltage by controlling the rate of discharge of the energy storage element to thereby sustain the unregulated DC voltage at its second value and maintain the regulated DC voltage applied to the electrical load at its prescribed value for the predetermined period of time following the loss of electrical energy from the AC supply.

The above, and other objects, features and advantages of the present invention will become apparent from the following description when read in conjunction with the accompanying drawing, in which like reference numerals designate the same elements.

DETAILED DESCRIPTION OF THE PREFERRED EMBODIMENT

Figure 1:
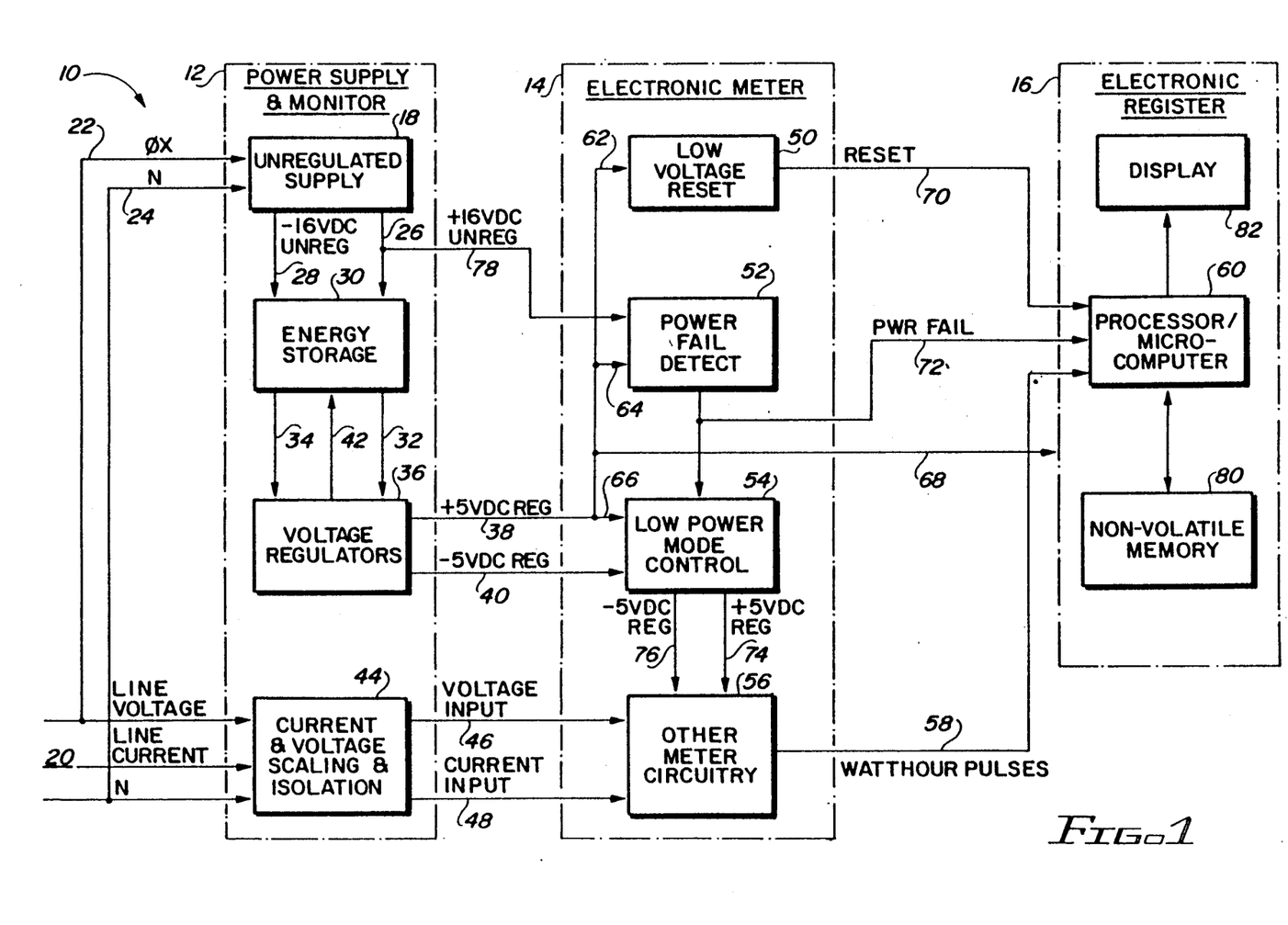
FIG. 1 is a block diagram of an electronic metering system of the invention incorporating a power supply and monitor, an electronic meter and an electronic register.

Referring now to FIG. 1, there is shown, generally at 10, an electronic metering system which includes a Power Supply and Monitor 12, an Electronic Meter 14 (such as a watthour meter) and an Electronic Register 16, such as a demand register.

The Power Supply and Monitor 12 includes an Unregulated Supply 18 for receiving an AC voltage from an AC Supply 20 (See FIG. 2) via two Conductors 22 and 24 designated 0X and N (neutral). Supply 18 rectifies the AC voltage input and produces at its output two unregulated DC voltages (+16 VDC UNREG and −16 VDC UNREG) on Conductors 26 and 28 respectively. These voltages are applied to an Energy Storage 30.

The Energy Storage 30 stores electrical energy provided by the ±16 VDC UNREG voltages and supplies those voltages, via Conductors 32 and 34, to Voltage Regulators 36. In response to the ±16 VDC UNREG voltages, Regulators 36 produce regulated output voltages ±5 VDC REG on Conductors 38 and 40. A control signal is provided from a current regulator in Regulators 36 to the Energy Storage on a Conductor 42 to control the rate of discharge of the Energy Storage upon the detection of a power outage by the Regulators 36. The development of this control signal and how it functions to control discharge rate of the Energy Storage will later be described.

For ease of illustration, the Power Supply and Monitor is shown as also including a Current and Voltage Scaling and Isolation block 44 for isolating the line voltage and line current supplied by AC Supply 20 and scaling down the voltage and current to suitable magnitudes for input to the Electronic Meter 14 via Conductors 46 and 48. The Voltage and Current Scaling and Isolation circuits may consist of those types of voltage transformers and current transformers or sensors conventionally used in watthour meters. A suitable current sensor for use with an electronic meter is disclosed in U.S. Pat. application Ser. No. 259,234, Filed 10/18/88, entitled Current Sensors and which is assigned to the assignee of the present invention. Such voltage and current transformers are conventionally mounted in the base of a meter and as such are not generally an integral part of the meter power supply.

The Electronic Watthour Meter 14 of FIG. 1 is generally of a well known prior art type. Representative prior art electronic meters suitable for use in the present invention are disclosed in the following U.S. Patents which are assigned to the assignee of the present invention and which are incorporated herein by reference: U.S. Pat. Nos. 4,535,287; 4,556,843; 4,620,150; 4,754,219; and 4,761,605.

The Electronic Meter 14 is shown as including a Low Voltage Reset 50, a Power Fail Detect 52, a Low Power Mode Control 54, and a Block 56 designated Other Meter Circuitry. Block 56 represents conventional electronic metering circuitry such as the prior art electronic meters disclosed in the last aforementioned patents.

The Meter Circuits 56 receive analog input signals proportional to line voltage and current via Conductors 46 and 48. During normal operation of the System 10, these signals are repeatedly sampled by the Meter Circuits 56, the samples of which are multiplied together to generate pulses on a Conductor 58 collectively representative of and proportional to electrical energy consumption (e.g. watthours, kilowatt hours or other measures, such as reactive power). For illustrative purposes, these pulses are shown as watthour pulses on Conductor 58 of FIG. 1.

The watthour pulses are provided to a data input of a Microprocessor or Computer 60 of the Register 16 where they are stored in well known fashion in the volatile memory of the Processor 60.

Referring back to the Electronic Meter 14, it will be noted that the +5 VDC REG voltage on Conductor 38 is provided to the Low Voltage Reset 50, the Power Fail Detect 52, the Low Power Mode Control 54, and to the Electronic Register 16 via Conductors 62, 64, 66 and 68 respectively. The −5 VDC REG voltage on Conductor 40 is supplied to the Mode Control 54 of the Meter 14. Two of these regulated voltages (±5 VDC REG) are provided to the Meter 14 and one (+5 VDC REG) to the Register 16 to provide the necessary bias voltages for the operation of the various circuits contained therein.

The Low Voltage Reset Circuit 50 monitors the +5 VDC REG voltage to effect the generation of a RESET signal on Conductor 70 for the Processor 60. The manner in which this signal is generated will be subsequently described.

Reference is now made to the Meter Circuitry 56 of the Electronic Meter 14. It will be noted that the ±5 VDC REG voltages are supplied to the Meter Circuitry 56 on Conductors 74 and 76 via the Mode Control 54. It will also be noted that the PWR FAIL signal from the Power Fail Detect Circuit 52 is applied as a control signal to the Mode Control 54. The purpose of the Mode Control 54 is to provide an orderly shutdown of the Meter Circuitry 56 upon the detection of a power outage by the Power Fail Detect Circuit 52. The Low Power Mode Control 54 may comprise a conventional electronic switch (such as a CMOS switch) which, when activated by the PWR FAIL signal, disables, or reduces, the ±5 VDC REG voltages to the Meter Circuitry 56. Such disabling, or reducing, will in effect shut down the Meter Circuitry 56 and thus quickly reduce the load on the Power Supply as seen by the Voltage Regulators 36 at Conductors 38 and 40. As will be seen, this ability to quickly reduce the load on the Power Supply enables the size of storage capacitors in the Energy Storage 30 to be minimized, while still providing sufficient energy storage capacity to sustain the ±5 VDC REG voltages at their proper levels for the required period of time following a power outage.

Reference is now made to the Power Fail Detect Circuit 52 of the Meter 14. This circuit monitors the +16 VDC UNREG voltage provided thereto on Conductor 78. The purpose of this circuit is to continuously monitor the magnitude of the +16 VDC UNREG voltage signal to detect a power outage of the AC Supply 20. When the +16 VDC UNREG signal drops to a prescribed threshold, the PWR FAIL signal on Conductor 72 signals the Processor 60 to begin an orderly shutdown of the Register 16, whereby the Processor 60 stores the meter data, and other information, from its volatile memory into a Non-Volatile Memory 80.

In the embodiment disclosed herein, the Electronic Register 16 can be of any one of several known prior art type demand registers. As illustrated, Register 16, in addition to having the Processor 60 and Non-Volatile Memory 80, also includes a Display 82, such as a liquid crystal display, for displaying metering data and other information which is provided thereto by the Processor 60. U.S. Pat. Nos. 4,571,692; 4,594,545; 4,598,248; and 4,620,150, among others, disclose representative electronic demand registers suitable for use with the present invention. The above patents are assigned to the assignee of the present invention.

Figures 2, 3:
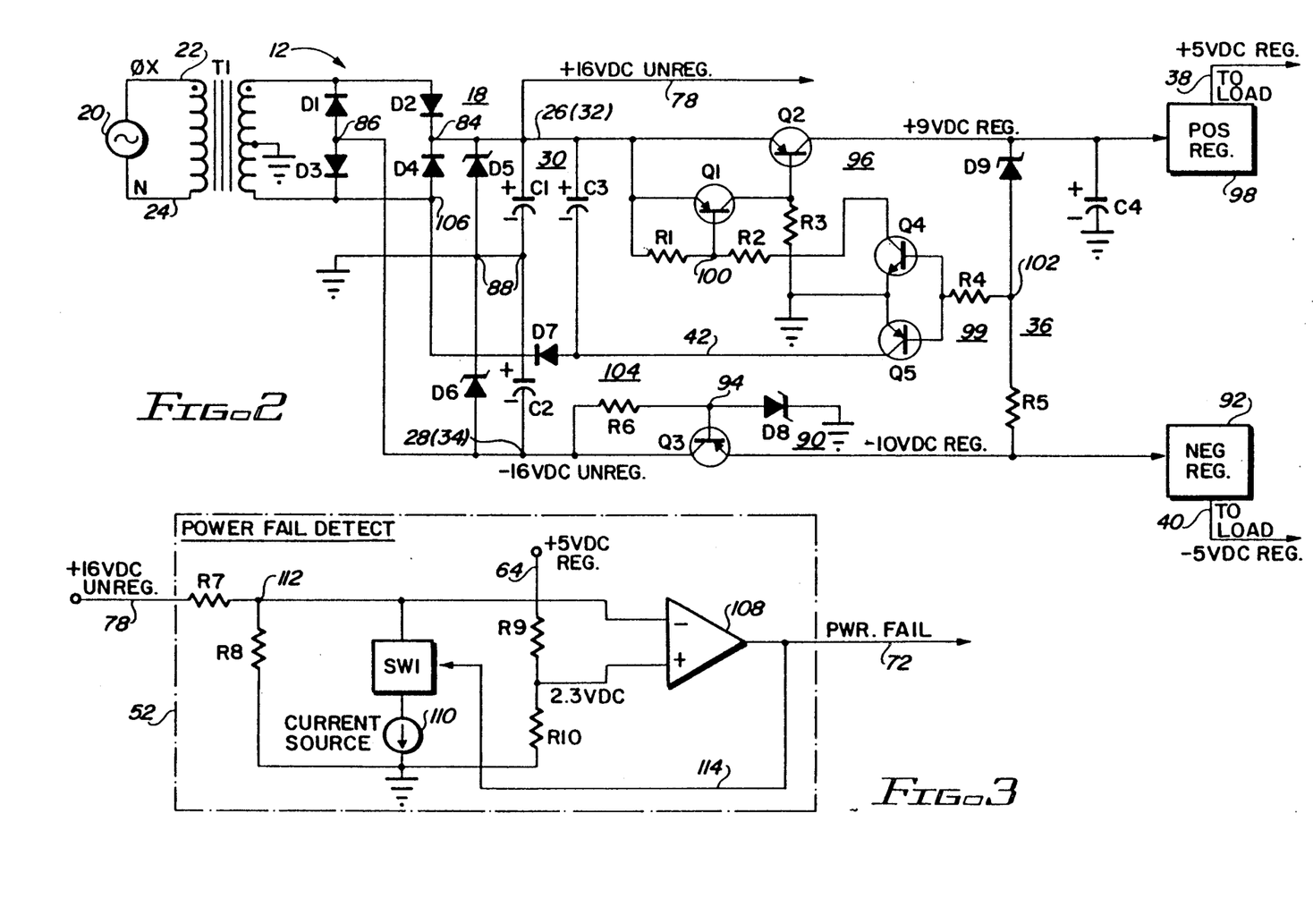
FIG. 2 is a schematic diagram of an embodiment of the power supply and monitor of FIG. 1.
FIG. 3 is a schematic diagram of a power fail detect circuit shown in FIG. 1.
Figure 4:
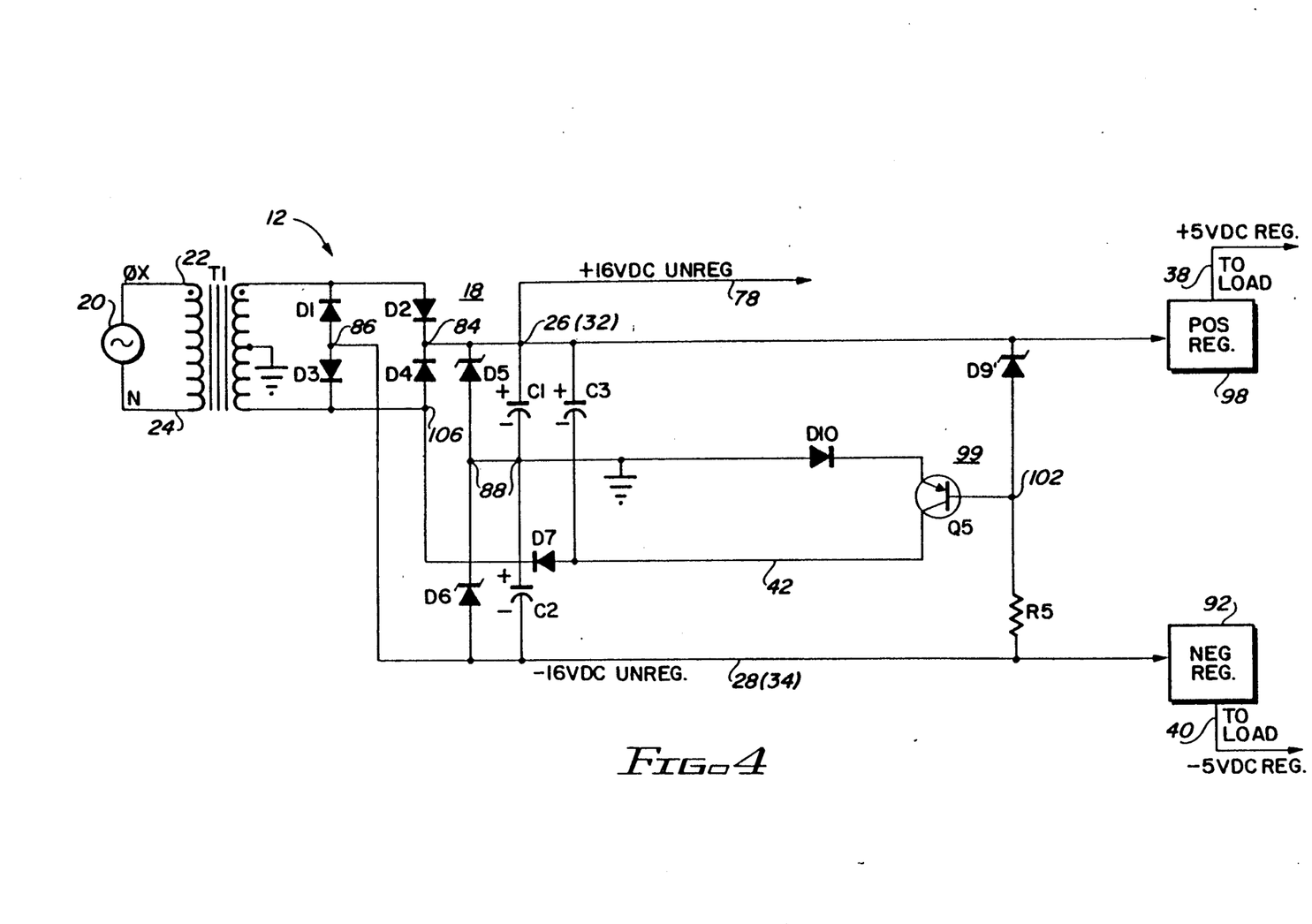
FIG. 4 is a schematic diagram of another embodiment of the power supply and monitor of FIG. 1.

Having briefly described the major functional elements of the invention, and prior to proceeding with detailed operational description thereof, it is considered advantageous to first describe the details of those elements as shown in FIGS. 2, 3 and 4.

Reference is first made to FIG. 2, which is a detailed schematic of the Power Supply and Monitor 12 comprised of the Unregulated Supply 18, Energy Storage 30 and Regulators 36.

The Power Supply of FIG. 2 is comprised of the Unregulated Supply 18 which is made up of a conventional Power Transformer T1, a conventional bridge rectifier consisting of diodes D1-D4, energy storage and filter capacitors C1 and C2 and Zener diodes D5 and D6. Capacitors C1 and C2 each have typical values of 1000 microfarads. Zener diodes D5 and D6 provide protection for the Power Supply against overvoltage and transients which may occur in the voltage applied to the primary winding of T1 from the AC Supply 20. Zener diodes D5 and D6 are each 22 volt devices, such as a 1N5358A. As shown in FIG. 2, the +16 VDC UNREG voltage is provided from the Unregulated Supply 18 on Conductor 78 which is connected to the + terminal of C1 and to a Junction 84 of diodes D2 and D4. In a similar manner the —16 VDC UNREG voltage is provided from the—terminal of C2 on Conductor 28 which is connected to a Junction 86 of diodes D1 and D3.

Capacitors C1 and C2 are connected in series across the output of the Unregulated Supply 18 and are grounded along with diodes D5 and D6 at a Junction 88. When voltage from AC Supply 20 is applied to the Power Supply, capacitor C1 develops a charge across it of approximately +16 volts. Likewise, capacitor C2 develops a charge across it of approximately —16 volts. As a result of these two charges, the total voltage across C1 and C2 is approximately 32 volts.

The Voltage Regulators 36 are comprised basically of three circuits for regulating the +5 VDC REG voltage and circuits for regulating the —5 VDC REG voltage.

The circuits for regulating the —5 VDC REG voltage consists of two voltage regulators, a Negative Pre-regulator, shown generally as 90, providing a —10 VDC REG voltage to a final Negative Voltage Regulator 92. The Negative Regulator 92 produces the —5 VDC REG voltage at its output on Conductor 40. The Negative Regulator 92 may be a commercially available voltage regulator, a suitable type being an MC7905 solid state regulator manufactured by Motorola.

The Negative Pre-regulator 90 consists of a PNP Transistor Q3 (such as a 2N5193) an 11 volt Zener diode D8 (such as a 1N5241B), and a Resistor R6 having a preferred value of 1 Kilohm. The emitter of Q3 is connected to the input of the final Negative Regulator 92 and serves to provide the aforementioned —10 VDC REG voltage thereto. Diode D8 and Resistor R6 are connected in series between ground (at the cathode of D8) and the collector of Q3. Base current for controlling the conduction of Q3 is provided by a connection to its base from a Junction 94 between R6 and D8. The collector of Q3 is connected to Conductor 28 (34) and receives the —16 VDC UNREG voltage from the Unregulated Supply 18. The operation of the Negative Pre-regulator 90 is rather conventional and, as such a detailed operational description thereof is not deemed necessary. However, suffice to say, under normal Power Supply operating conditions, the conduction of Q3 is controlled by base current from Junction 94 to accurately regulate the —10 VDC REG voltage in response to changes in the magnitude of the —16 VDC UNREG voltage.

As previously mentioned, the circuit for regulating the +5 VDC REG voltage consists of three voltage regulators; (i) a Positive Pre-regulator, shown generally as 96 producing a +9 VDC REG voltage, (ii) a final Positive Regulator 98 which receives the +9 VDC REG voltage and produces the +5 VDC REG voltage at its output on Conductor 38 and (iii) a feedback current or control regulator 99 for providing a feedback control signal for controlling the rate of discharge of a Capacitor C3 in the Energy Storage 30. The Positive Regulator 98 may be a commercially available voltage regulator, a suitable type being an LM317 adjustable solid state regulator manufactured by Linear Technology Corporation.

The Positive Pre-Regulator 96 consists of PNP Transistors Q1 and Q2 (such as a 2N3906 and a 2N5193 respectively), an NPN Transistor Q4 (such as a 2N3904), an 8.2 volt Zener diode D9 (such as a 1N4694), and resistors R1, R2, R3, R4 and R5. Resistors R1-R5 typically have values of 100 Kilohms, 22 Kilohms, 4.7 Kilohms, 1 Kilohm and 22 Kilohms respectively. The collector of Q2 is connected to the input of the final Positive Regulator 98 and serves to provide the aforementioned +9 VDC REG voltage thereto. The emitters of transistors Q1 and Q2 are each connected to the Junction 84 at the output of the Unregulated Supply 18 and receive therefrom, via Conductor 26 (32), the +16 VDC UNREG voltage. The collector of Q1 is connected to the base of Q2, with that base being connected to one end of resistor R3 having its other end grounded. Current for controlling the conduction of transistor Q1 is provided to its base from a Junction 100 between series connected resistors R1 and R2. One end of R1 is connected to the emitter of Q1 at the output of the Unregulated Supply 18 on Conductor 26(32). One end of resistor R2 is connected to the collector of Q4, the emitter of which is connected to ground at one end of R3. Resistor R4 is connected at one end to the base of Q4 and at its other end to a Junction 102 between diode D9 and resistor R5. Resistor R5 and diode D9 are connected in series across the +9 VDC REG and —10 VDC REG voltages at the outputs of the Pre-regulators 90 and 96. Diode D9, in conjunction with resistors R4 and R5, serves to provide base current for controlling the conduction of transistors Q4 and Q5.

Still referring to FIG. 2, the Energy Storage Circuit 30 of the present invention will now be described. This circuit, shown generally as 104, is comprised of a diode D7 (such as a 1N4004), a storage cell or capacitor C3 having a preferred value of 1000 microfarads, and a PNP transistor Q5 (such as a 2N3906). Diode D9 and resistors R4 and R5 also form elements of the Energy Storage 30, and are shared with the previously described Positive Pre-regulator 96. As will be seen, the capacitor C1 also plays a significant role in the operation of the invention and operates as one element of the Energy Storage Circuit 104 to help sustain the +5 VDC REG voltage at its prescribed magnitude for a period of time, following a power outage, sufficiently long to enable an orderly shutdown of the Electronic Meter 14 and the Electronic Register 16.

The storage capacitor C3, along with capacitor C1, has its + terminal connected at the +16 VDC UNREG output of the Unregulated Supply 18 as shown at Junction 84 and Conductor 26(32). The — terminal of capacitor C3 is connected, via diode D7, to one end of the secondary winding of transformer T1 at a Junction 106 of diodes D3 and D4. The — terminal of C3 is also connected, via the control line or Conductor 42, to the collector of transistor Q5.

While not essential to the operation of the invention, a filter capacitor C4 is connected from the +9 VDC REG voltage to ground and serves to filter out any ripple in that voltage prior to application to the final Positive Regulator 98.

An operational description of the Power Supply and Monitor 18, and the circuits thereof, can be more readily understood after a description of the Power Fail Detect and Low Voltage Reset Circuits 52 and 50 respectively.

Reference is now made to FIG. 3 in conjunction with FIG. 1, wherein it can be seen that the Power Fail Detect Circuit 52 monitors the +16 VDC UNREG voltage on Conductor 78 from the Unregulated Supply 18. As previously described, the Detect Circuit 52 provides a binary 1 PWR FAIL signal, via Conductor 72, to the Processor 60 and the Mode Control 54 upon the occurrence of a power failure in the AC Supply 20.

Basically the Detect Circuit 52 is a threshold voltage comparator which compares the magnitude of the +16 VDC UNREG voltage with a predetermined reference or threshold voltage. As shown in FIG. 3, this reference voltage is provided at the junction of a voltage divider comprised of two resistors R9 and R10 connected between ground and the +5 VDC REG voltage on Conductor 64. The ratio of the resistors R9 and R10, in the disclosed embodiment, provide a +2.3 VDC reference voltage to the + input terminal of a conventional operational Comparator Amplifier 108.

The +16 VDC UNREG voltage is applied to a − input terminal of Amplifier 108 via a resistor R7. Resistor R7, in conjunction with a resistor R8 which is connected between ground and a Junction 112, form a second voltage divider for providing the proper voltage to the − terminal of Amplifier 108. The ratio of R7 and R8 are chosen so that the voltage at the − terminal of Amplifier 108 is equal to or greater than the +2.3 VDC reference when the input voltage on Conductor 78 to R7 is +16 volts. Resistors R7 and R8 typically have values of 162 Kilohms and 46.4 Kilohms respectively. During normal operation of the system (AC Supply 20 operating), the +16 VDC UNREG voltage is at +16 volts. When a power outage occurs at Supply 20, the +16 VDC UNREG voltage will begin to decay toward zero volts. The manner in which this decay occurs will subsequently be described.

In the preferred embodiment, when the +16 VDC UNREG voltage drops to a threshold of approximately +10 volts, the voltage at the − input terminal of Amplifier 108 drops to a level (determined by the ratio of R7 and R8 in conjunction with the +2.3 VDC threshold) which causes the output of Amplifier 108 to go from a binary 0 state (0 volts) to a binary 1 state (+5 volts) to thus provide the PWR FAIL signal to the Processor 60 and to the Mode Control 54.

When the PWR FAIL signal goes to a binary 1 logic state, that signal is provided, via a Control Line 114, to the input of a normally open conventional switch (such as a CMOS Switch) SW1. In response to the PWR FAIL signal on Line 114, SW1 closes to switch in a Current Source 110. SW1 is connected to the Junction 112 of R7 and R8. Thus, when SW1 closes it applies or injects a prescribed current (referred to as a hysteresis current) into the junction of R7 and R8 which causes the voltage at the junction to decrease by a prescribed amount. Current Source 110 may be any suitable device for injecting the proper current, such as a precision current supply or merely a precision resistor connected between SW1 and ground which is switched in parallel with R8 to thus change the ratio of R7 and R8 and allow the voltage at Junction 112 to fall by the proper amount to a prescribed level.

The purpose of injecting the above described hysteresis into the Junction 112 will become apparent in the ensuing operational description of the invention.

Reference is now made to the Low Voltage Reset Circuit 50 of FIG. 1. Reset Circuit 50 is a prior art circuit of known design, the details of which can be found in the aforementioned U.S. Pat. No. 4,591,782. In that patent, the Low Voltage Reset 50 is disclosed in FIG. 7 thereof as a Processor Reset Generator 80, and a detailed description of the operation thereof can be found in Column 8, line 62 through 68, and Column 9, lines 1 through 18. U.S. Pat. No. 4,591,782 is specifically incorporated herein by reference for that detailed description. However, for purposes of clarity and understanding of the present invention, the following operational description of the Low Voltage Reset Circuit 50 will be given.

As seen in FIG. 1, the Low Voltage Reset 50 continuously monitors the magnitude of the +5 VDC REG voltage provided thereto from the Voltage Regulators 36 via Conductors 38 and 62. During normal operation of the system (i.e., AC Supply 20 operating), the voltage on Conductor 62 is at +5 VDC and the reset signal on Conductor 70 to the Processor 60 is held low at a binary 0 state (0 volts). After a prescribed period of time following a power outage, the +5 VDC REG voltage will begin to decay from its nominal +5 volt level toward zero volts. In the preferred embodiment, when this voltage decreases to an approximate +4 volt threshold, the RESET signal on Conductor 70 jumps from approximately zero volts (binary 0 level) to approximately +4 volts (binary 1 level) and then follows the +5 VDC REG voltage as it decays further toward zero. When power is restored following a power outage, or at the time of initial system power up, the Low Voltage Reset 50 will also generate the RESET signal as a pulse on Conductor 70 as the voltage on Conductor 62 passes through the +4 volt threshold level toward the normal regulated +5 VDC level.

An operational description of the invention will now be given, with reference first being made to FIG. 2. Let it first be assumed that the system is in normal operation with the AC Supply 20 supplying electrical energy (e.g. 120 VAC) to transformer T1. The secondary winding of T1 steps the input voltage down to a proper level for rectification by the Unregulated Supply 18 to generate the ±16 VDC UNREG voltages. Capacitors C1 and C2 each develop a charge thereacross of 16 volts to thus produce the +16 VDC UNREG voltage on Conductor 26(32) and the −16 VDC UNREG voltage on Conductor 28(34).

The voltage at the collector of Q2 is normally regulated at a +9 VDC level by the Positive Pre-regulator 96. This regulation is explained by first referring to the Zener diode D9 in conjunction with resistors R4 and R5. Resistor R5 serves to provide bias current for Zener diode D9. Resistor R4, in conjunction with R5 and D9, serves to provide the proper base current for controlling the conduction of transistors Q4 and Q5. In the embodiment of FIG. 2, Zener diode D9 is an 8.2 volt device, such as a type 1N4694.

Diode D9 and series connected resistor R5 are connected across the outputs of the Pre-regulators 90 and 96 to thus continuously monitor the +9 VDC REG voltage at the cathode of D9. D9 continuously operates in its avalanche breakdown region to maintain a substantially constant 8.2 volt voltage drop thereacross, while the current through D9 will vary (increase or decrease) with corresponding changes in the magnitude of the +9 VDC REG voltage. Thus, it can be seen that D9 functions as a current regulator to control the current flowing through R4, R5 and the emitter/base junctions of transistors Q4 and Q5.

During normal operation (i.e., +9 VDC REG voltage at approximately +9 Volts), diode D9 operates to sustain a regulated positive voltage (e.g. approximately +0.6 to +1.0 volt) at the bases of Q4 and Q5 to cause Q4 to conduct and turn off Q5. This voltage at the base of Q4 is controlled by current flowing through R4 and R5 as regulated by D9, and its magnitude at the base of Q4 is a function of the ratio of the voltage drop across the emitter/base junction of Q4 and the total drop across R4 and R5.

Transistor Q4 normally operates in its linear region as a current regulator. The emitter/collector current of Q4 varies in response to small variations in its base voltage to control the voltage at its collector and thus the voltage applied therefrom to resistor R2.

Still referring to FIG. 2, reference is now made to transistors Q1 and Q2. These two transistors also normally operate in their linear regions and function together to maintain the voltage at the collector of Q2 at +9 volts. As shown, the base of Q1 is connected at Junction 100 of the voltage divider comprised of R1 and R2. The collector of Q1 is connected as a control input for Q2 at its base. Resistor R3 serves to provide base bias current for Q2. One end of R1, along with the emitter of Q1, is connected to Conductor 26(32) and monitors the +16 VDC UNREG voltage. As previously mentioned, a control voltage is provided to one end of R2 from the collector of Q4.

During normal operation, the conduction of Q4 controls the magnitude of the voltage at Junction 100 at the proper level to control the collector current of Q1 at the proper level to control the conduction of Q2 to regulate and maintain the +9 VDC REG voltage at its nominal +9 volt level. As previously described, the Positive Regulator 98 receives the +9 VDC REG voltage to in turn provide the +5 VDC REG voltage to the various circuits in the Meter 14 and the Register 16.

Still referring to FIG. 2, reference is now made to the Energy Storage 104 and in particular to the diode D7, capacitor C3 and transistor Q5 thereof. As previously described, during normal system operation, Q5 is kept turned off (non-conducting) by the positive voltage applied to its base via R4. As can be seen, with Q5 turned off there is no load across capacitor C3. As a result, C3 is able to be charged, via diode D7, to a voltage of approximately 32 volts. This charging is from the Positive Unregulated Supply 18 (+16 VDC UNREG on Conductor 26) to a negative voltage approximately equal to the −16 VDC UNREG Supply Voltage. Diode D7 functions as a half-wave rectifier to charge C3 each time the voltage at the Junction 106 (cathode of D7) goes negative (approximately −16 volts) with respect to the positive voltage (approximately +16 VDC UNREG) at Junction 84 on Conductor 26(32). While full-wave charging of C3 can be provided, it has been found that half-wave charging of C3 is more than adequate because there is no load across C3 during normal operation. For a continued detailed operational description and understanding of the Energy Storage 104 and the invention reference is now made to FIG. 5.

As previously described, during normal system operation, the +16 VDC UNREG, +5 VDC REG and −5 VDC REG voltages are sustained at their normal levels. The levels of these voltages, along with the levels and states of the other key voltages and signals for controlling the operation of the invention are shown in the timing diagram of FIG. 5.

Figure 5:
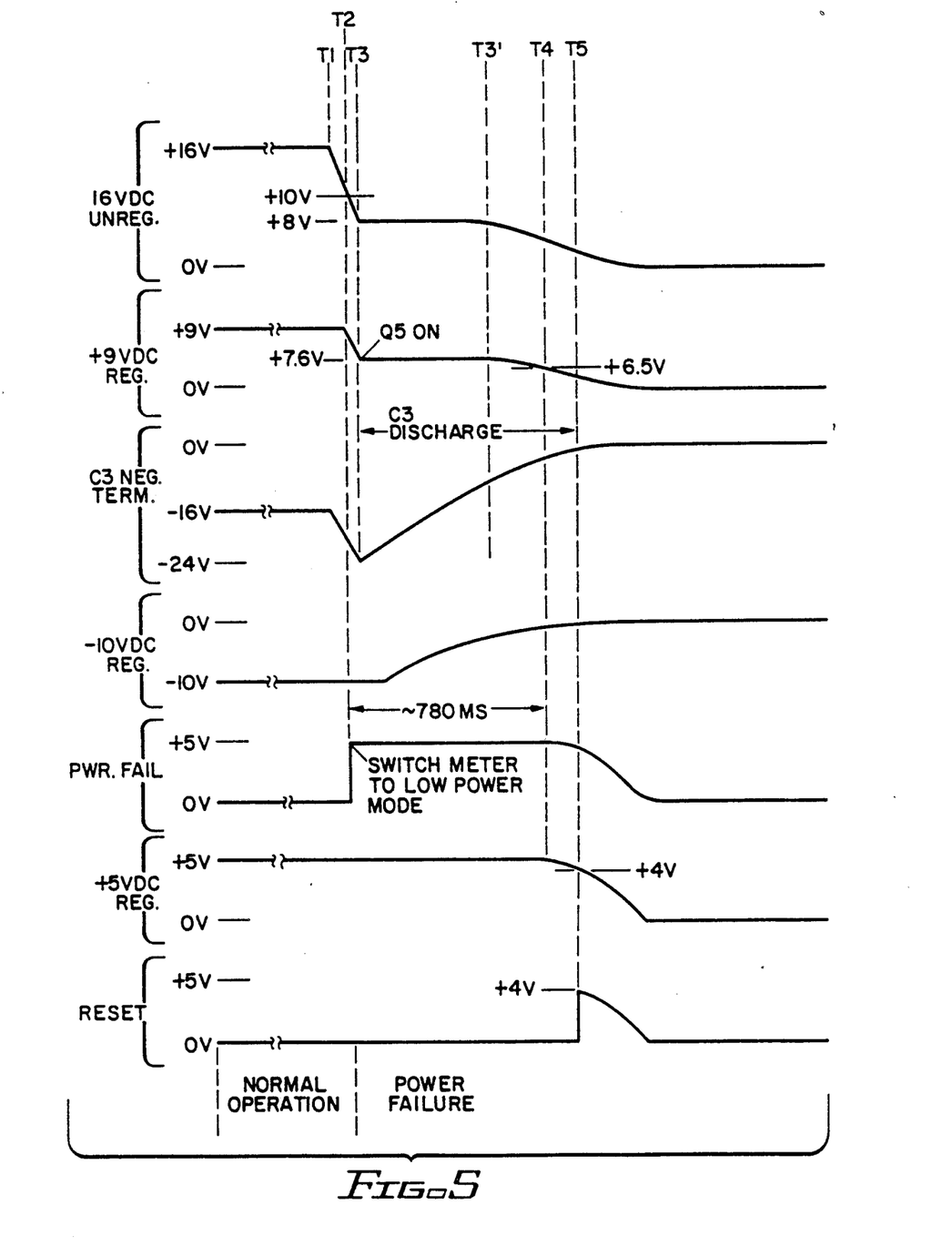
FIG. 5 is a timing diagram showing the timing relationships between various signals illustrated in the several figures and is useful in understanding the operation of the invention.

Referring now to the left side of FIG. 5 to a column labeled "Normal Operation", the levels and states of the above voltages and signals are illustrated. As can be seen, the +16 VDC UNREG voltage on Conductor 78 to the Power Fail Detect Circuit 52 (FIGS. 1 and 3) is keeping the Comparator Amplifier 108 out of conduction to thus hold the PWR FAIL signal on Conductor 72 to the Processor 60 and the Mode Control 54 at a binary 0 state or zero volt level. In this state, the PWR FAIL signal has no affect on the operation of the Processor 60 or the Mode Control 54.

Also shown in FIG. 5 is the level of the +5 VDC REG voltage applied during normal operation to all of the various circuits of the Electronic Meter 14 and the Electronic Register 16. Of particular interest at this time is the state of the RESET signal on Conductor 70 connecting the Low Voltage Reset 50 to the Processor 60. As can be seen, the RESET signal is at a binary 0 state, or 0 volt level, so long as the +5 VDC REG voltage is at +5 volts. During normal system operation, the RESET signal has no affect on the Processor 60.

Still referring to FIG. 5, let it now be assumed that a power outage has occurred in the AC Supply 20, thus resulting in a loss of all power at the input to the Unregulated Supply 18. The operations which take place at the time of a power outage and subsequent hereto, are shown in a column designated "Power Failure".

In FIG. 5, the power outage is shown as occurring at a time T1, at which time capacitors C1 and C2 begin to discharge through the normal load on the Power Supply and Monitor 12 as seen at the outputs of the Positive and Negative Regulators 92 and 98 on Conductors 40 and 38 respectively. This discharge is shown at the top of FIG. 5 where the +16 VDC UNREG voltage decays from its normal +16 volt level to a +8 volt level at a time T3. Discharge of the −16 VDC UNREG voltage is not illustrated in FIG. 5, but it is understood that that voltage also decays at substantially the same rate and follows the +16 VDC UNREG voltage. It is significant to note that, during the period from T1 to T3, capacitor C1 supplies sufficient energy to the Positive Pre-regulator 96 to sustain the magnitude of the voltage at the collector of Q2 (FIG. 3) at a level sufficient to enable the final Positive Regulator 98 to regulate the +5 VDC REG voltage at its normal level to thus allow continued operation of the Electronic Meter 14 and the Electronic Register 16. The Positive final Regulator 98 will continue to sustain the +5 VDC REG voltage at +5 volts until the +9 VDC REG voltage drops to approximately +6.5 volts at a time T4. At this time, the +5 VDC REG voltage will begin to decay toward 0 volts as the +9 VDC REG voltage continues to decay toward 0 volts.

As can be seen in FIG. 5, as capacitor C1 discharges, the +16 VDC UNREG voltage passes through a first threshold of +10 volts at a time T2. It is at this instant that the Power Fail Detect Circuit 52 (FIG. 3) detects the power outage and this, in turn, generates the +5 volt binary PWR FAIL signal on Conductor 72. As shown in FIG. 1, this signal is applied to the Low Power Mode Control 54 and to the Processor 60.

The PWR FAIL signal activates the Mode Control 54 to switch the Electronic Meter 14 to its low power operating mode by essentially instantly removing the + and −5 VDC REG voltages from the Meter Circuitry 56. This removing in essence shuts down all of the circuits in the Meter 14, except for those circuits required to allow the Processor 60 to store data from its volatile memory into the Non-volatile Memory 80; namely, the Low Voltage Reset 50 and the Power Fail Detect 52. This instant shutdown of the Meter Circuitry 56 has the distinct advantage of greatly reducing the load on the power supply and Monitor 12 at the instant of power outage detection, the result of which is to reduce the load on capacitors C1 and C3. Reducing the load on these capacitors allows their discharge time to be lengthened over a longer period of time following the power outage. This would not be possible if the full load on the power supply were present during the power down sequence following the power outage. A further advantage in this instant reduction in load, allows the values, and thus the sizes, of capacitors C1 and C3 to be smaller, thus resulting in a reduction in cost and aiding toward miniaturization of the Supply and Monitor 12.

Still referring to FIG. 5, it should be noted that, at time T2 when the +16 VDC UNREG voltage passes through the +10 volt threshold, Pre-regulator 96 begins to shut down. As a result, the +9 VDC REG voltage from Pre-regulator 96 begins to decay from its normal +9 volt level to a +7.6 volt level. The decay time of this latter voltage is from T2 to T3 and that voltage falls in unison with the +16 VDC UNREG voltage.

The Energy Storage 30 is activated at time T3 to sustain the +5 VDC REG voltage at its normal +5 volts level for the required period of time to allow Processor 60 to carry out the storage of data into the Non-volatile Memory 80. This activation is effected by the turning on of transistor Q5 when the +9 VDC REG voltage achieves approximately +7.6 volts. To understand the results of this activation and the operation of the Energy Storage 30 in response to that activation, reference is now made to FIGS. 2 and 5.

It will be recalled from the previous description that capacitor C3 has a charge across it of approximately 32 volts during normal operation. At time T3 capacitor C3 still has this charge. This charge is maintained from T1-T3 as shown in FIG. 5 where the voltage at the − terminal of C3 decays from −16 volts to −24 volts (range of 7 volts) in unison with the +16 VDC UNREG voltage at the + terminal of C3 which decays over the same 8 volt range from +16 volts to +8 volts. It will also be recalled that C3 is allowed to charge, via diode D7, because transistor Q5 is kept turned off by a positive voltage at its base as regulated by Zener diode D9. It will further be recalled that capacitor C1 provides the energy during the period T1-T3 to sustain the +5 VDC REG voltage at its normal +5 volt level. At time T3, capacitor C1 no longer contains a sufficient energy charge to sustain this voltage at the +5 volt level. It is at T3 that transistor Q5 becomes active to control the discharge of capacitor C3 to further sustain the +5 VDC REG voltage at +5 volts for the required period of time for the Processor 60 to carry out the aforementioned storage of data.

As shown in FIG. 5, transistor Q5 is turned on when the +9 VDC REG voltage decays to the +7.6 volt level. At this time (T3) the +16 VDC UNREG voltage is at approximately +8 volts. In the present embodiment, Q5 is turned on at T3 when its base voltage drops from its normal positive level to a level of approximately −0.6 to −1 volts. This drop is controlled by diode D9. It will be recalled that diode D9 is an 8.2 volt Zener diode which regulates the current through R4 and R5 and thus regulates the voltage applied to the base of Q5 via resistor R4. The +7.6 volts at the cathode of D9 causes a reduction in the current therethrough, with a consequent increase in the current through R4, thus allowing the base of Q5 to go negative to approximately −0.6 volts.

Transistor Q4 is turned off at time T3 by the −0.6 volt level at its base at the same time that Q5 is turned on. As can be seen in FIG. 2, when Q4 turns off, collector current ceases to flow with a consequent ceasing of current flow through R2. As a result, the voltage at the base (Junction 100) of Q1 rises sufficiently positive to turn Q1 off. When Q1 turns off, its collector current ceases to flow, thus allowing the bases of Q2 to go sufficiently negative (as determined by bias resistor R3) to drive Q2 into saturation. When Q2 is in saturation, there is an approximate 0.4 volt drop across its emitter/collector junction Thus, its collector output voltage (+7.6 volts) will follow its input emitter voltage (+8 volts).

Reference is now made to FIGS. 2 and 5. As shown in FIG. 5, the voltage at the − terminal of C3 at time T3 is at −24 volts. Since the collector of Q5 is connected to that terminal, via Conductor 42, it is also at −24 volts. As shown in FIG. 2, when Q5 conducts capacitor C3 begins to linearly discharge from time T3 to T5. This discharge is controlled by a feedback control signal or current from the collector of Q5 to the − terminal of C3. As shown, as C3 discharges, the voltage at its − terminal rises from −24 volts to approximately 0 volts. This voltage is directly proportional to current flowing in Q5.

It should be noted that, as the voltage on the − terminal of C3 rises from the −24 volt level toward the 0 volt level, the +16 VDC UNREG voltage on Conductor 26(32) remains flat at the +8 volt level and then begins to decay from +8 volts toward 0 volts as the voltage on the − terminal of C3 approaches its 0 volt level. This decay is shown as beginning at a time T3, and continuing to time T5, at which time +16 VDC UNREG voltage is approximately 7 volts. From time T3, to T5 the +16 VDC UNREG voltage substantially linearly follows the voltage at the − terminal of C3 as the voltage at the − terminal of C3 approaches the 0 volt level.

Reference is now made to the +9 VDC REG voltage line of FIG. 5. It is significant to note that the positive Pre-regulator 96, at the collector of Q2 (FIG. 2), regulates that voltage at the +7.6 volt level from time T3 through a time T3′. At approximately time T3′ the voltage at the collector of Q2 begins to decay toward 0 volts in unison with the decay of the +16 VDC UNREG voltage going from +9 volts toward 0 volts.

As can be seen in FIG. 5, the +5 VDC REG voltage at the output of the final Positive Regulator 98 (FIG. 2) remains at the +5 volt level from time T3 through approximately T4, at which time the +9 VDC REG voltage is at a +6.5 volt level. It is at this voltage level that the Regulator 98 begins to shut down (i.e., can no longer regulate its output at +5 volts). This shutdown is shown on the +5 VDC REG line where that voltage begins to decay, at approximately time T4, from +5 volts toward 0 volts. Thus, it can be seen that the Energy Storage Circuit 30, upon detection of a power outage, sustains the +5 VDC REG voltage applied to the Meter 14 and the Processor 16 at its normal +5 volt level for the period from approximately time T2 through approximately T4. In the disclosed embodiment, this period is shown as approximately 780 milliseconds long, which is more than sufficient time for the Processor 60 to store its data from its volatile memory into the Non-volatile Memory 80.

Still referring to FIG. 5, it will be noted that the PWR FAIL signal from the output of the Amplifier 108 in the Fail Detect Circuit 52 (FIG. 3) decays from +5 volts to 0 volts and follows the +5 VDC REG voltage as it decays to 0 volts.

The RESET signal to the Processor 60 is generated at time T5 by the Low Voltage Reset 50 (FIG. 1). This signal is generated at the instant the +5 VDC REG voltage decays to the +4 volt level as shown in FIG. 5. As previously described herein, and as described in the aforementioned U.S. Pat. No. 4,591,782, the Low Voltage Reset 50 responds to this +4 volt level to generate the +4 volt RESET signal to reset the Processor 60 after it has completed its storing of data in the Non-volatile Memory 80. It will be noted that the RESET signal decays to 0 volts, following its generation at T5, and follows the decay of the +5 VDC REG voltage.

In the present invention, it is important that the Processor 60 respond only to serious power outages of a sustained nature and not those short momentary power outages of a few milliseconds which can occur in a power distribution system such as AC Supply 20. Protection against the detection of these momentary power outages is provided by the combination of a time delay programmed into the Processor 60 and the affect that the aforementioned hysteresis has on the operation of the Power Fail Detect Circuit of FIG. 3.

It will be recalled from the previous description that the PWR FAIL signal signals the Processor 60 to begin its process of storing the data in its volatile memory into the Non-volatile Memory 80. A part of this process is the activation of the aforementioned delay. When the Fail Detect Circuit 52 generates the PWR FAIL signal (see FIGS. 3 and 5), the Processor 60 immediately responds to that signal to start a programmed delay counter. This counter will time out after a prescribed interval of time (i.e., delay period). At the end of the delay period, the Processor 60 then enters its read/write cycle to store the data from its volatile memory into the Non-volatile Memory 80.

The purpose of the delay period is to ensure that the detected power outage is in fact a serious outage and not an outage of a momentary nature. During the delay period, the processor continuously monitors the level of the PWR FAIL signal. If the PWR FAIL signal remains at its binary 1 state (FIG. 5) through the delay period, it is deemed a serious power outage. On the other hand, if the PWR FAIL signal drops to a binary 0 state prior to expiration of the delay period it is deemed a momentary power outage. If it is deemed a momentary outage, the Processor 60 responds to the binary 0 PWR FAIL signal to cancel, or ignore, the delay and bypass entering the aforementioned read/write cycle.

In the preferred embodiment a delay period of 120 milliseconds has been chosen as an optimum delay time before entering the read/write cycle to store data into the Non-volatile Memory 80. It is well known that non-volatile memories are quite slow, a typical read/write cycle taking about 250 milliseconds. Thus, it can be seen that the +5 VDC REG voltage must be sustained for at least 370 milliseconds following a power outage to allow Processor 60 to complete its read/write cycle for the Non-volatile Memory 80. As shown in FIG. 5, more than ample time is available to complete this cycle as indicated by the 780 millisecond period before the +5 VDC REG voltage begins to decay. This lengthy period has been deliberately designed into the invention to provide a guard band to provide for changes in the initial tolerance of circuit components and also changes due to age and temperature. For example, the capacitance of C3 (FIG. 3) over time might be reduced to nearly half of its nominal value. Thus a guard band of 410 milliseconds (780−370=410) is built in to compensate for worst case conditions, while ensuring that the 370 millisecond time period required will always be provided.

Reference is now made to FIG. 3. It will be recalled from the previous description that, upon the detection of a power outage by the Fail Detect Circuit 52, switch SW1 and Current Source 110 respond to the PWR FAIL signal to inject a hysteresis current or voltage into the Junction 112 of resistors R7 and R8. The purpose of injecting this hysteresis is twofold; (i) to prevent turning the Amplifier 108 on and off as a result of two or more closely occurring consecutive momentary power outages, and (ii) to ensure that capacitor C3 is always charged at a level sufficient to sustain the +5 VDC REG voltage at +5 volts for the required time following each impending outage, and to further ensure that the Power Fail Detect Circuit does not remove the PWR FAIL signal until C3 has charged to the required level.

To understand how this injected hysteresis functions to control Amplifier 108 and the charging of C3, reference should first be made to the power supply and monitor of FIG. 2 and to FIG. 5.

It will be recalled that, upon detection of a power outage and at time T3, capacitor C3 has a 32 volt charge across it. At time T3, C3 begins to discharge (Q5 on) thus linearly reducing its charge over the interval T3–T4. Let it now be assumed that the power outage is only momentary (e.g., 20–100 millisecond period) and that power is restored at some time during that period. This restoration of course occurs following time T3, and at the time of that restoration the charge across capacitor C3 has been reduced to some unknown value determined by the time of the power outage and the discharge rate by C3.

To understand the significance of the injected hysteresis and its effect on the operation of Amplifier 108 and the charging of C3 following the restoration of power, it is important to remember that C3, at the instant of power restoration has some indeterminate charge less than its normal 32 volt charge. Further, it has been determined that C3 must have a minimum voltage of 28 volts stored across it at the time of any power outage detection in order to be able to provide sufficient energy to the Regulators 96 and 98 to sustain the +5 VDC REG voltage at the +5 volt level for the required period of time (i.e., at least a 370 millisecond period).

To achieve the above minimum 28 volt charge, it has also been determined that a suitable hysteresis to be injected at Junction 112 (FIG. 3) is 25 microamperes.

This current keeps the voltage at the − terminal of Amplifier 108 sufficiently low (i.e., less than the −23 VDC threshold) to keep the PWR FAIL signal high (binary 1) pending restoration of power. In addition, this current (i.e., 25 microamperes X 162 Kilohms of R7=4 volts) at Junction 112 results in a hysteresis voltage of +4 volts appearing at the output of the Unregulated Supply 18 which must be overcome by the voltage on Conductor 78 in order for the − terminal of Amplifier 108 to go sufficiently positive (i.e., greater than +2.3 volt threshold) to disable Amplifier 108 and thus detect the restoration of power by driving PWR FAIL signal to a binary 0 state.

By referring to FIGS. 2 and 3 it can be seen that the 25 microamperes of current at Junction 112 inserts a hysteresis at that point which forces the capacitor C1 of the Unregulated Supply 18 to charge to at least +14 (i.e., 10 volts +4 volts=14 volts) volts after restoration of power in order to overcome the hysteresis and thus disable Amplifier 108. It will also be noted that capacitors C1 and C2 each charge to 14 volts, thus placing a total charge of 28 volts across the unregulated supply. It is significant to note that C3 is now charged to +28 volts (the total voltage across the output at the Unregulated Supply 18) to thus be able to sustain the +5 VDC REG voltage through the next power outage, should it occur before C3 has charged to its normal +32 volts.

Reference is now made to FIG. 4 which is a schematic of another embodiment of the Power Supply and Monitor of the present invention. Elements in FIG. 4 are labeled with corresponding like elements in FIG. 2. The circuit of FIG. 4 is essentially the same as FIG. 2, except that it does not incorporate the Pre-regulators 90 and 96.

The components of the Current Regulator 99 are of the same types and values as previously described in connection with FIG. 2, except that Zener diode D9' is a 9.1 volt device, and a type 1N4148 diode D10 has been added.

The Unregulated Supply 18 and the Current Regulator 99 operates substantially as explained for the embodiment of FIG. 2. In this embodiment, however, the Current Regulator 99 directly monitors the +and −16 VDC UNREG voltages on Conductors 26(32) and 28(34) respectively. Diode D10 has been included to avoid excessive reverse voltage on the emitter-base junction of Q5. While not previously mentioned, but worthy of note here, in the embodiment of FIG. 2, transistor Q4 serves to clamp the reverse voltage on Q5, and resistor R4 serves to limit the base-emitter current.

Having described preferred embodiments of the invention with reference to the accompanying drawing, it is to be understood that the invention is not limited to those precise embodiments, and that various changes and modifications may be effected therein by one skilled in the art without departing from the scope or spirit of the invention as defined in the appended claims.

What is claimed is:

1. In a metering system of the type including a meter for measuring electrical energy consumption and providing pulse data proportional to such consumption to an electronic register of the type having a non-volatile data storage and a processor including a volatile data storage, the combination comprising:
   (a) an AC supply;
   (b) a power supply, connected to said AC supply and responsive to electrical energy therefrom, for producing an unregulated DC voltage;
   (c) energy storage means, including a current regulator, connected to said power supply, for storing electrical energy from said unregulated DC voltage and having sufficient storage capacity to effectively maintain the magnitude of said unregulated DC voltage at a prescribed voltage level for a predetermined period of time following a loss of said AC supply, said current regulator monitoring said unregulated DC voltage and being responsive thereto, following a loss of said AC supply, when the magnitude thereof decays from a first prescribed voltage level to a second prescribed voltage level to control the rate that said energy storage means gives up its stored electrical energy and sustain said unregulated DC voltage at substantially said second voltage level for said predetermined period of time;
   (d) a voltage regulator, responsive to said unregulated DC voltage, for providing a regulated DC voltage of a prescribed magnitude to said electronic register, said voltage regulator regulating said regulated DC voltage at its prescribed magnitude for at least said predetermined period of time; and
   (e) means responsive to said unregulated Dc voltage, upon the loss of said AC supply, for providing a control signal to said electronic register to signal said processor to write data from its volatile data storage into said non-volatile data storage when the magnitude of said unregulated DC voltage decays to a prescribed threshold, the writing of the data from said volatile data storage to said non-volatile data storage being completed during said predetermined period of time.

2. The metering system in accordance with claim 1 wherein said energy storage means further includes at least one capacitor connected across the output of said power supply and which accumulates a charge thereacross which is approximately twice the magnitude of the unregulated DC voltage.

3. The metering system in accordance with claim 2 wherein said at least one capacitor is charged through a diode connected between said power supply and one end of said at least one capacitor.

4. The metering system in accordance with claim 2 wherein said current regulator is connected across the output of said power supply for monitoring said unregulated DC voltage and providing a control current to one end of said at least one capacitor to linearly control the discharge rate thereof to sustain said unregulated DC voltage at said second prescribed voltage level for said predetermined period of time.

5. The metering system in accordance with claim 4 wherein said current regulator is comprised of a Zener diode in series with a resistor connected across the output of said power supply and a transistor having an input thereof connected at a junction between said Zener diode and said resistor and an output thereof connected to said one end of said at least one capacitor.

6. The metering system in accordance with claim 1 further including means, connected to said voltage regulator and responsive to a decrease in the magnitude of the regulated DC voltage therefrom from its normal regulated value to a prescribed value for providing a reset signal to said processor, the decrease occurring substantially at the end of said predetermined period of time.

7. In a metering system of the type for measuring electrical energy consumption, the combination comprising:
   (a) an AC supply for supplying electrical energy;
   (b) a power supply, connected to said AC supply and responsive to electrical energy therefrom, for producing an unregulated DC voltage;
   (c) energy storage means, including a current regulator, connected to said power supply, for storing electrical energy from said unregulated DC voltage and having sufficient storage capacity to effectively maintain the magnitude of said unregulated DC voltage at a prescribed voltage level for a predetermined period of time following a loss of said AC supply, said current regulator monitoring said unregulated DC voltage and being responsive thereto, following a loss of said AC supply, when the magnitude thereof decays from a first prescribed voltage level to a second prescribed voltage level to control the rate that said energy storage means gives up its stored electrical energy and sustain said unregulated DC voltage at substantially said second voltage level for said predetermined period of time;
   (d) a voltage regulator, responsive to said unregulated DC voltage, for producing a regulated DC voltage of a prescribed magnitude, said voltage regulator regulating said regulated DC voltage at its prescribed magnitude for at least said predetermined period of time;
   (e) an electronic register, coupled to said voltage regulator and being powered by the regulated DC voltage produced thereby, said electronic register including,
      (i) a processor, having a volatile data storage, for storing electrical energy consumption data as represented by data pulses provided thereto, and
      (ii) a non-volatile data storage in communication with said processor; and
   (f) an electronic meter, coupled to said voltage regulator and being powered by the regulated DC voltage produced thereby, and being connected to said AC supply, for measuring electrical energy consumption and providing the data pulses to said processor for storage, in said volatile data storage, as electrical energy consumption data, said electronic meter including,
      (i) detect means responsive to said unregulated DC voltage, upon the loss of said AC supply, for providing a power fail detect signal to said electronic register to signal said processor to write data from its volatile data storage into said non-volatile data storage when the magnitude of said unregulated DC voltage decays to a prescribed threshold, the writing of the data from said volatile data storage to said non-volatile data storage being completed during said predetermined period of time,
      (ii) reset means, connected to said voltage regulator and responsive to a decrease in the magnitude of the regulated DC voltage therefrom to a prescribed value, for providing a reset signal to said processor, the decrease occurring substantially at the end of said predetermined period of time, and
      (iii) means, responsive to the power fail detect signal from said detect means, for powering down said electronic meter by disabling the application of the regulated DC voltage provided thereto from said voltage regulator.

8. The metering system in accordance with claim 7 wherein said energy storage means further includes at least one capacitor connected across the output of said power supply and which accumulates a charge thereacross which is approximately twice the magnitude of the unregulated DC voltage.

9. The metering system in accordance with claim 8 wherein said at least one capacitor is charged through a diode connected between said power supply and one end of said at least one capacitor.

10. The metering system in accordance with claim 8 wherein said current regulator is connected across the output of said power supply for monitoring said unregulated DC voltage and providing a control current to one end of said at least one capacitor to linearly control the discharge rate thereof to sustain said unregulated DC voltage at said second prescribed voltage level for said predetermined period of time.

11. The metering system in accordance with claim 10 wherein said current regulator is comprised of a Zener diode in series with a resistor connected across the output of said power supply and a transistor having an input thereof connected at a junction between said Zener diode and said resistor and an output thereof connected to said one end of said at least one capacitor.

12. The combination comprising:
   (a) an AC supply for supplying electrical energy;
   (b) at least one electrical load;
   (c) a power supply connected to said AC supply, including means for producing at least one unregulated DC voltage from the electrical energy provided by said AC supply
   (d) energy storage means, including a current regulator, connected to said power supply, for storing electrical energy from said at least one unregulated DC voltage and having sufficient storage capacity to effectively maintain the magnitude of said at least one unregulated DC voltage at a prescribed voltage level for a predetermined period of time following a loss of said AC supply,
   said current regulator monitoring said at least one unregulated DC voltage and being responsive thereto, following a loss of said AC supply, when the magnitude of said at least one unregulated DC voltage decays from a first prescribed voltage level to a second prescribed voltage level to control the rate that said energy storage means gives up its stored electrical energy and sustain said at least one unregulated DC voltage at substantially said second voltage level for said predetermined period of time;
   (e) at least one voltage regulator, responsive to said at least one unregulated DC voltage, for producing at least one regulated DC voltage of a prescribed magnitude for powering said at least one electrical load, said at least one voltage regulator regulating said at least one regulated DC voltage at its prescribed magnitude for at least said predetermined period of time; and
   (f) means responsive to said at least one unregulated DC voltage for signaling said at least one electrical load of a loss of said AC supply, and a consequent impending loss of said at least one regulated DC voltage being provided at said at least one electrical load, when the magnitude of said at least one unregulated DC voltage decays to a prescribed threshold.

13. In a metering system of the type including a meter for measuring electrical energy consumption and providing pulse data proportional to such consumption to an electronic register of the type having a non-volatile data storage and a processor including a volatile data storage, the combination comprising:
   (a) an AC supply;
   (b) a power supply, connected to said AC supply and responsive to electrical energy therefrom, for producing an unregulated DC voltage;
   (c) energy storage means, connected to said power supply, for storing electrical energy from said unregulated DC voltage and having sufficient storage capacity to effectively maintain the magnitude of said unregulated DC voltage at a prescribed voltage level for a predetermined period of time following a loss of said AC supply;
   (d) pre-regulator means, connected to said power supply and said energy storage means, for producing a first regulated DC voltage from said unregulated DC voltage, said pre-regulator means including control means, connected to said energy storage means, for monitoring said first regulated DC voltage and responsive thereto, following a loss of said AC supply, when the magnitude of said first regulated voltage decays from a first prescribed voltage level to a second prescribed voltage level to control the rate that said energy storage means gives up its stored electrical energy to maintain the magnitude of said unregulated DC voltage provided to said pre-regulator means at a magnitude sufficient to sustain said first regulated DC Voltage at substantially said second voltage level for said predetermined period of time;
   (e) final regulator means, responsive to said first regulated DC Voltage, for producing a second regulated DC voltage of a prescribed magnitude for powering said electronic register, said final regulator means regulating said second regulated DC voltage at its prescribed magnitude for at least said predetermined period of time; and
   (f) means responsive to said unregulated DC voltage, upon the loss of said AC supply, for providing a control signal to said electronic register to signal said processor to write data from its volatile data storage into said non-volatile data storage when the magnitude of said unregulated DC voltage decays to a prescribed threshold, the writing of the data into said non-volatile storage being completed during said predetermined period of time.

14. The metering system in accordance with claim 13 wherein said energy storage means includes a capacitor connected across the output of said power supply and accumulates a charge thereacross which is approximately twice the magnitude of the unregulated DC voltage.

15. The metering system in accordance with claim 14 wherein said capacitor is charged through a diode connected between said power supply and one end of said capacitor.

16. The metering system in accordance with claim 14 wherein said control means comprises a current regulator, connected across the output of said pre-regulator means and said power supply, for monitoring said first regulated DC voltage and providing a control current to the end of said capacitor to linearly control the discharge rate thereof to maintain the magnitude of said unregulated voltage provided to said pre-regulator means at a voltage level sufficient to sustain said first regulated DC voltage at substantially said second voltage level for said predetermined period of time.

17. The metering system in accordance with claim 16 wherein said current regulator is comprised of a Zener diode in series with a resistor connected across the output of said pre-regulator means and said power supply and a transistor having an input thereof connected at a junction between said Zener diode and said resistor and an output thereof connected to said one end of said capacitor.

18. The metering system in accordance with claim 13 further including means, connected to said final regulator means and responsive to a decrease in the magnitude of said second regulated DC voltage therefrom from its normal regulated value to a prescribed value, for providing a reset signal to said processor, the decrease occurring substantially at the end of said predetermined period of time.

19. A method of sustaining the application of operating voltage applied to an electrical load following the loss of electrical energy from an AC supply, comprising the steps of:
   (a) producing an unregulated DC voltage from the electrical energy provided by said AC supply;
   (b) storing a sufficient quantity of expendable electric energy from said unregulated DC voltage to maintain the magnitude of said unregulated DC voltage at a prescribed voltage level for a predetermined period of time following a loss of electrical energy from said AC supply;
   (c) monitoring said unregulated DC voltage for a decay in the magnitude thereof from a first prescribed voltage level to a second prescribed voltage level to detect a loss of electrical energy from said AC supply;
   (d) signalling said electrical load of an impending power outrage resulting from a detection in the loss of electrical energy from said AC supply;
   (e) in response to a decay in the magnitude of said unregulated DC voltage, sustaining the magnitude of said unregulated DC voltage at substantially said second prescribed voltage level for said predetermined period of time by controlling the rate of expenditure of the stored expendable electric energy; and
   (f) producing, from said unregulated DC voltage, a regulated DC operating voltage for said electrical load, the magnitude of said regulated DC operating voltage being normally regulated at a prescribed value while said unregulated DC voltage is at substantially said first prescribed voltage level, and further being regulated at said prescribed value for at least said predetermined period of time that said unregulated DC voltage is sustained at substantially said second prescribed voltage level.

20. A method of sustaining the application of operating voltage applied to an electrical load following the loss of electrical energy from an AC supply, comprising the steps of:
   (a) producing an unregulated DC voltage from the electrical energy provided by said AC supply;
   (b) storing a sufficient quantity of expendable electric energy from said unregulated DC voltage to maintain the magnitude of said unregulated DC voltage at a prescribed voltage level for a predetermined period of time following a loss of electrical energy from said AC supply;

(c) producing, from said unregulated DC voltage, a first regulated DC voltage;

(d) monitoring said first regulated DC voltage for a decay in the magnitude thereof from a first prescribed voltage level to a second prescribed voltage level to detect a loss of electrical energy from said AC supply;

(e) signalling said electrical load of an impending power outrage resulting from a detection in the loss of the electrical energy from said AC supply;

(f) in response to a decay in the magnitude of said first regulated DC voltage, sustaining the magnitude of said unregulated DC voltage at a voltage level sufficient to maintain said first regulated DC voltage at substantially said second prescribed voltage level for said predetermined period of time by controlling the rate of expenditure of the stored expendable electric energy; and (g) producing, from said first regulated DC voltage, a second regulated DC voltage for powering said electrical load, the magnitude of said second regulated DC voltage being normally regulated at a prescribed value while said first regulated DC voltage is at substantially said first prescribed voltage level, and further being regulated at said prescribed value for at least said predetermined period of time that said first regulated DC voltage is maintained at substantially said second prescribed voltage level.

21. In a metering system a method for controlling an electronic register of a type having an electronic processor, a volatile data storage and a non-volatile data storage, and an electronic meter which provides data pulses proportional to electrical energy consumption to said electronic register, comprising the steps of:

(a) producing at least one unregulated DC voltage from electrical energy provided by an AC supply;

(b) producing at least one regulated DC voltage from said unregulated DC voltage for powering said electronic register and said electronic meter, said at least one regulated DC voltage being regulated at a prescribed value in response to a decay in the magnitude of said unregulated DC voltage from a first prescribed voltage level to a second prescribed voltage level;

(c) storing a predetermined quantity of expendable electric energy from said unregulated DC voltage, the stored electric energy being of a sufficient quantity to maintain said regulated DC voltage at its regulated value for a predetermined period of time following a loss of said AC supply;

(d) notifying said electronic processor, following a loss of said AC supply, to write data from its volatile data storage into said non-volatile data storage when the magnitude of said unregulated DC voltage decays below a prescribed threshold; and (e) monitoring said unregulated DC voltage, and in response to a decay in the magnitude thereof to substantially said second prescribed voltage level, regulating the magnitude of aid unregulated DC voltage at substantially said second prescribed voltage level for said predetermined period of time by controlling the rate of expenditure of the stored electric energy to thereby maintain said regulated DC voltage at its prescribed regulated value for a period of time sufficient for said electronic processor to write data into said non-volatile data storage.

22. The method in accordance with claim 21 wherein the step of notifying further includes the step of powering down said electronic meter.

23. The method in accordance with claim 21 further including the step of resetting said electronic processor in response to said regulated DC voltage decaying from its prescribed regulated value, to a prescribed lower value.

* * * * *